United States Patent
Giesen et al.

(10) Patent No.: US 12,317,409 B2
(45) Date of Patent: May 27, 2025

(54) CIRCUIT BOARD LOCAL ELECTROMAGNETIC SHIELDING

(71) Applicant: INTERNATIONAL BUSINESS MACHINES CORPORATION, Armonk, NY (US)

(72) Inventors: Kyle Indukummar Giesen, Pittsboro, NC (US); Patrick James McKeone, Beacon, NY (US); Zachary Thomas Dreiss, Wappingers Falls, NY (US); Egduard Ramon Jauregui, Aurora, CO (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 18/339,564

(22) Filed: Jun. 22, 2023

(65) Prior Publication Data

US 2024/0431019 A1    Dec. 26, 2024

(51) Int. Cl.
*H05K 1/02* (2006.01)
(52) U.S. Cl.
CPC ......... *H05K 1/0218* (2013.01); *H05K 1/0298* (2013.01); *H05K 2201/0715* (2013.01)
(58) Field of Classification Search
CPC .............. H05K 1/0218; H05K 1/0298; H05K 2201/0715; H05K 1/0219
See application file for complete search history.

(56) References Cited

U.S. PATENT DOCUMENTS

| | | | |
|---|---|---|---|
| 6,180,876 B1 | 1/2001 | Holmes | |
| 6,614,325 B1 * | 9/2003 | Kocin | H05K 1/0245 |
| | | | 174/251 |
| 7,488,901 B2 | 2/2009 | Arnold | |
| 10,531,558 B2 | 1/2020 | Wu | |
| 10,595,409 B2 | 3/2020 | Elsherbini | |
| 11,037,884 B2 | 6/2021 | Seo | |
| 2002/0071265 A1 * | 6/2002 | Centola | H05K 9/0039 |
| | | | 361/753 |
| 2002/0166680 A1 | 11/2002 | Mazurkiewicz | |
| 2004/0240191 A1 | 12/2004 | Arnold | |

(Continued)

FOREIGN PATENT DOCUMENTS

WO    1999057952 A1    11/1999
WO    2021188784 A1    9/2021

OTHER PUBLICATIONS

Duffy, et al., "Improved Shielding Performance Using High Permeability Electroplated Thin Films in Printed Circuit Boards." Published Oct. 2011. 5 pages. In IEEE Transactions on Magnetics—IEEE Trans Magn. 47. 4282-4285. 10.1109/TMAG.2011.2153191.

*Primary Examiner* — Sherman Ng
(74) *Attorney, Agent, or Firm* — Stosch Sabo (57) ABSTRACT

A circuit board includes a ground layer, a core layer positioned on the ground layer, an insulating layer positioned on the core layer, and a trace positioned between the core layer and the insulating layer. The circuit board also includes another ground layer positioned on the insulating layer, and an electromagnetic shield (EMS) extending between and electrically connected to the ground layers alongside the trace to shield the trace from electromagnetic radiation. The EMS extends along at least 90% of a length of the trace.

18 Claims, 8 Drawing Sheets

(56) References Cited

U.S. PATENT DOCUMENTS

| | | | |
|---|---|---|---|
| 2019/0148807 A1* | 5/2019 | Sikina | H05K 1/0219 |
| | | | 333/238 |
| 2019/0150271 A1* | 5/2019 | Azadzoi | H05K 1/0219 |
| | | | 333/238 |
| 2019/0371737 A1 | 12/2019 | Kim | |
| 2021/0144844 A1 | 5/2021 | Lee | |
| 2021/0168935 A1* | 6/2021 | Lin | H01L 23/66 |
| 2022/0240373 A1* | 7/2022 | Chada | H01P 3/04 |

* cited by examiner

FIG. 1

(Operation 202)

FIG. 2A

(Operation 204)

FIG. 2B

(Operation 206)

FIG. 2C

(Operation 208)

FIG. 2D

(Operation 210)

FIG. 2E

(Operation 212)

(Operation 406)

FIG. 6A

(Operation 414)

FIG. 6B

CIRCUIT BOARD LOCAL ELECTROMAGNETIC SHIELDING

BACKGROUND

The present disclosure relates to computing systems, and more specifically, to electromagnetic interference (EMI) shielding for circuit boards.

Printed circuit boards (PCBs) are made from stacked layers of cores and pre-preg with electronic components on top. The cores include metal layers that form traces that connect different electronic components together. High-speed signals that are transmitted through these traces can be sensitive to electromagnetic radiation from the environment, so an electromagnetic shield (EMS) can be formed around the exterior of the PCB. However, such shields can cost time and money to make, as well as occupying space on the PCB that could otherwise be used for functional features. Furthermore, high-speed signals can be affected by the electronic components or other traces in the PCB. Unfortunately, these effects may only be discovered after construction of a PCB, and redesigning and remedying the issues can also cost significant amounts of time, money, and space.

SUMMARY

According to one embodiment of the present disclosure, a circuit board includes a ground layer, a core layer positioned on the ground layer, an insulating layer positioned on the core layer, and a trace positioned between the core layer and the insulating layer. The circuit board also includes another ground layer positioned on the insulating layer, and an electromagnetic shield (EMS) extending between and electrically connected to the ground layers alongside the trace to shield the trace from electromagnetic radiation. The EMS extends along at least 90% of a length of the trace.

According to another embodiment of the present disclosure, a circuit board includes a ground layer, a core layer positioned on the ground layer, an insulating layer positioned on the core layer, and a trace positioned between the core layer and the insulating layer. The circuit board also includes another ground layer positioned on the insulating layer, an electromagnetic shield (EMS) extending between and electrically connected to the ground layers alongside the trace to shield the trace from electromagnetic radiation, and another EMS extending between and electrically connected to the ground layers alongside the trace on an opposite side of the trace from the EMS to shield the trace from electromagnetic radiation.

According to another embodiment of the present disclosure, a circuit board includes a ground layer, a core layer positioned on the ground layer, an insulating layer positioned on the core layer, and a trace positioned between the core layer and the insulating layer and connected to a via. The circuit board also includes another ground layer positioned on the insulating layer, and an electromagnetic shield (EMS) extending between and electrically connected to the ground layers alongside a side of the trace, around the via, and alongside another side of the trace to at least partially surround the trace and to shield the trace from electromagnetic radiation.

DETAILED DESCRIPTION

Figure 1:
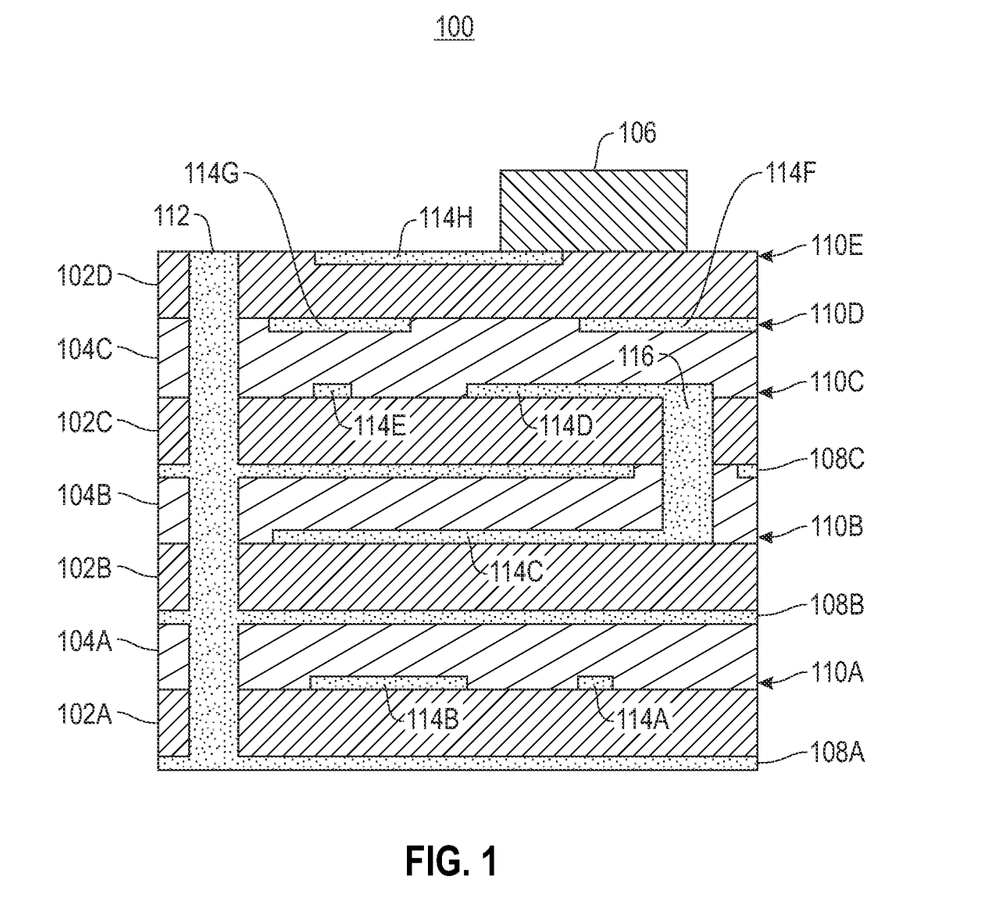
FIG. 1 is a side cross-sectional view of a multi-layer circuit board, according to an embodiment of the present disclosure.

FIG. 1 is a side cross-sectional view of multi-layer printed circuit board (PCB) 100. In the illustrated embodiment, PCB 100 comprises a plurality of cores 102A-102D (collectively "cores 102") and insulators 104A-104C (collectively "insulators 104") alternatingly stacked upon one another with electronic component 106 (e.g., a capacitor or an integrated circuit chip) on top of the uppermost core (e.g., core 102D). Cores 102 include metallic (e.g., copper) layers on or in the top and/or bottom that form, for example, ground layers 108A-108C (collectively "ground layers 108") and wiring layers 110A-110E (collectively "wiring layers 110"). Ground layers 108 are electrically connected to ground via 112 that traverses through all levels of PCB 100 to which makes an electrical ground available to many locations within PCB 100. Wiring layers 110 include traces 114A-114H (collectively "traces 114") that can transmit power and/or signals (such as high-speed signals) through PCB 100. Traces 114 can be connected to different traces 114 on different levels of PCB 100 using, for example, a buried via 116. Thereby, many electronic components (such as electronic component 106) can be connected together to provide, for example, capability and functionality to a larger a computing system (not shown).

Figure 2A:
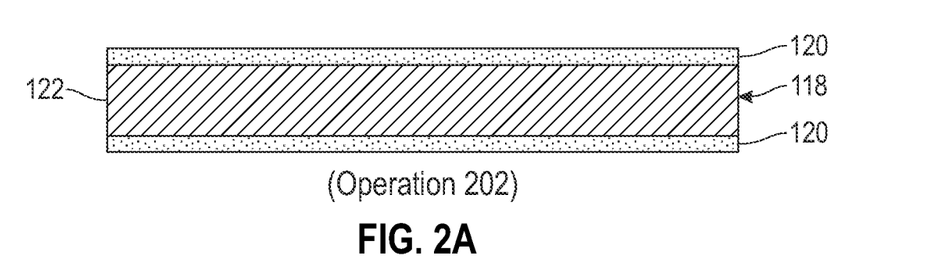
FIGS. 2A-2G are side cross-sectional views of stages in a manufacture of a portion of the multi-layer circuit board, in accordance with an embodiment of the present disclosure.
Figure 2B:
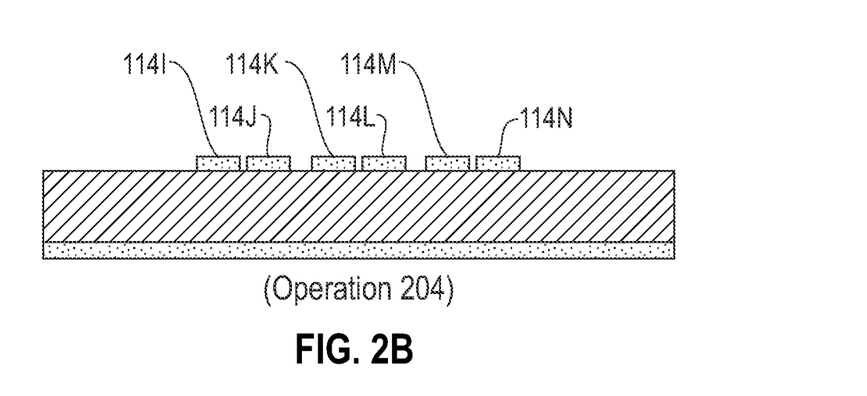
Figure 2C:
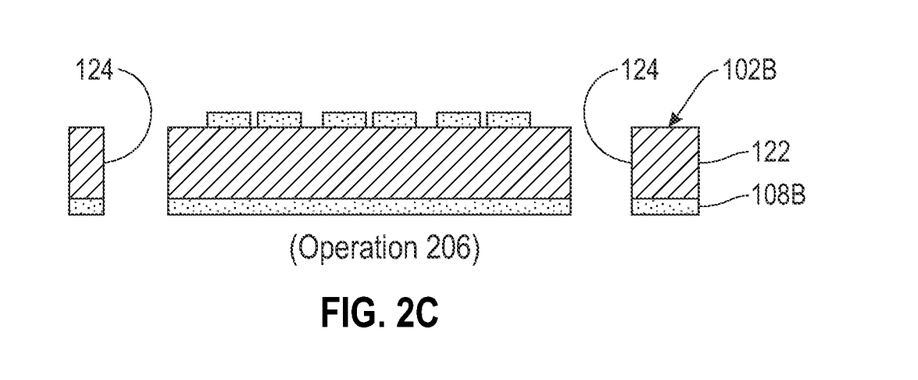
Figure 2D:
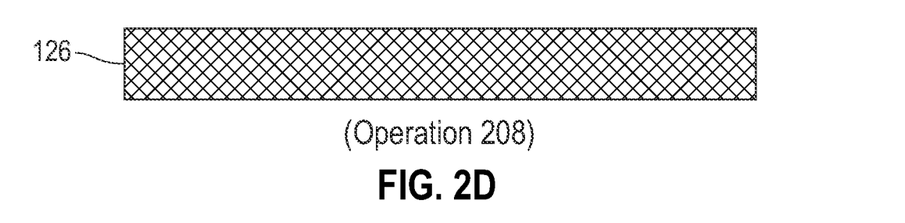
Figure 2E:
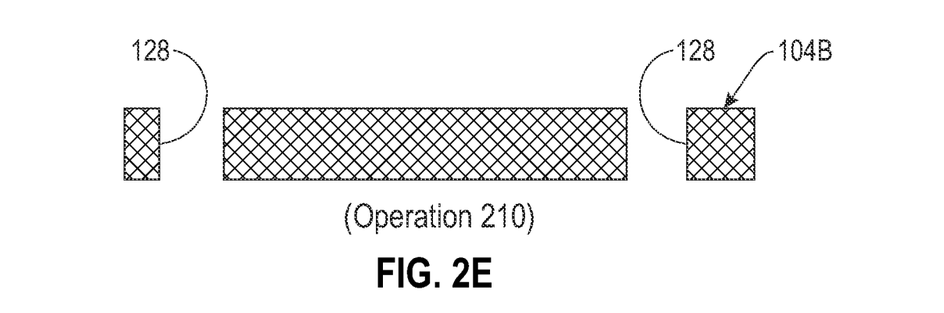
Figure 2F:
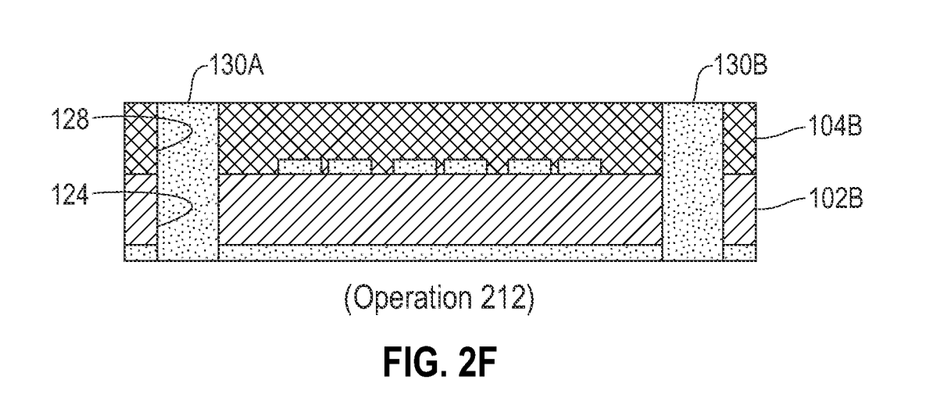
Figure 2G:
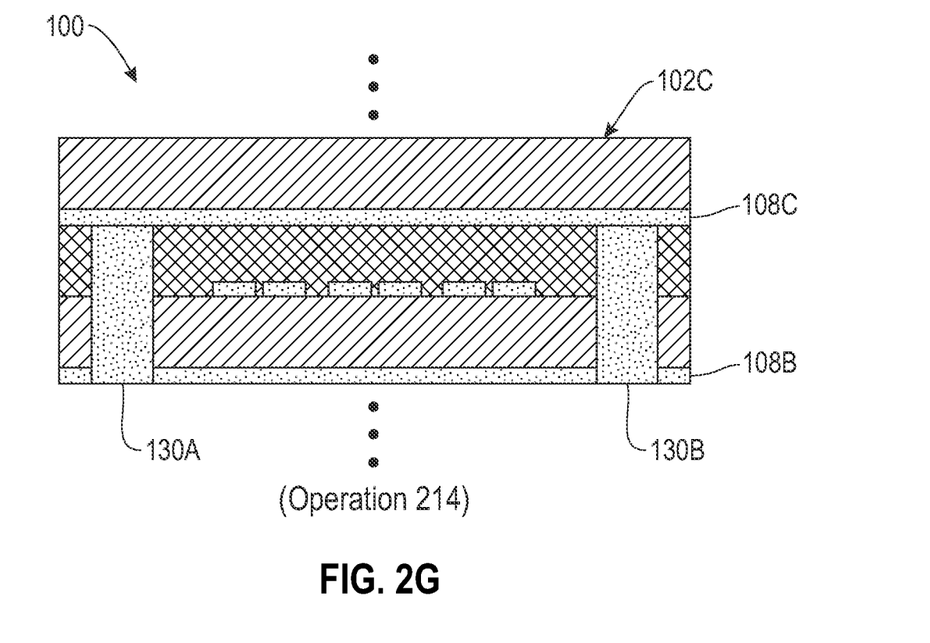
Figure 3:
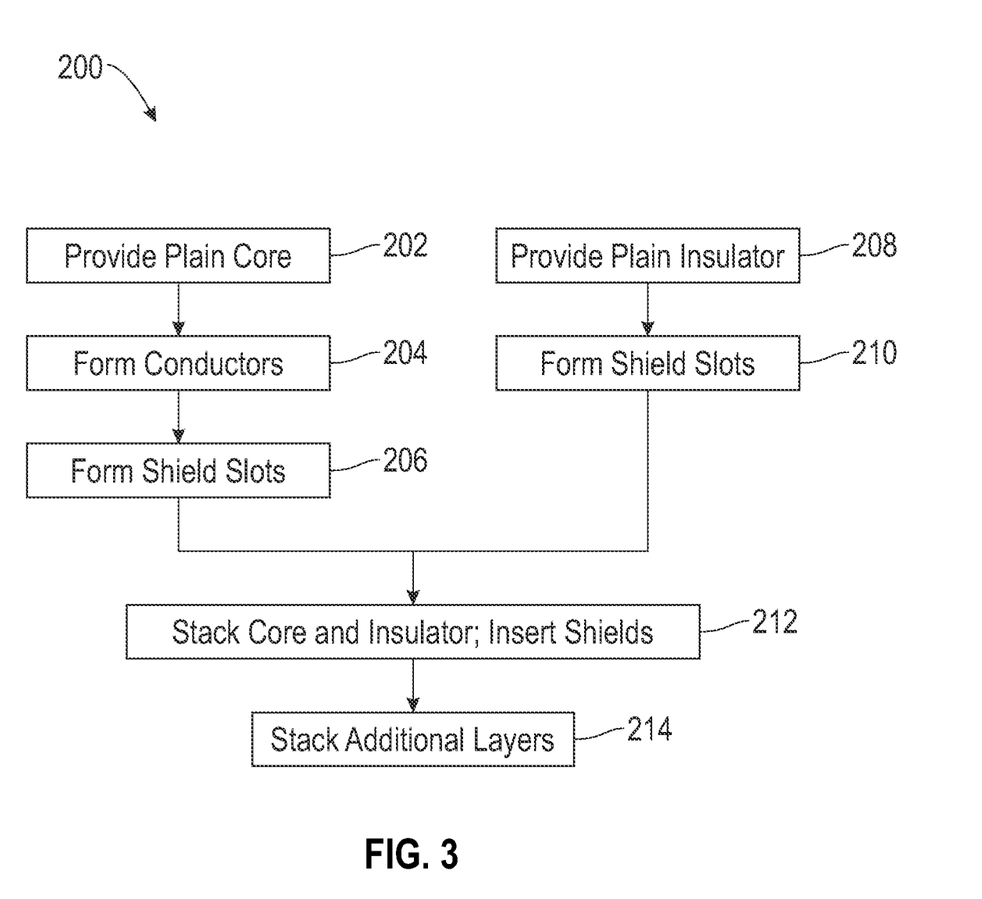
FIG. 3 is a flowchart of a method of manufacturing the portion of the multi-layer circuit board, in accordance with an embodiment of the present disclosure.

FIGS. 2A-2G are side cross-sectional views of stages in a manufacture of a portion of PCB 100 (that was not shown in FIG. 1). FIG. 3 is a flowchart of method 200 of manufacturing the portion of the multi-layer circuit board. The results of each operation in method 200 is illustrated in one of FIGS. 2A-2G, so FIGS. 2A-2G and 3 will be discussed in conjunction with one another.

In the illustrated embodiment, at operation 202, a core blank 118 (which may also be referred to herein as a plain core) is provided having electrically conductive (e.g., metallic) sheets 120 on the top and bottom sides of core center 122. At operation 204, traces 1141-114N are formed, for example, by removing material from sheets 120 (e.g., via etching, routing, and/or cutting). At operation 206 slots 124 are formed, for example, by removing more material from core blank 118 such that slots 124 extend through core center 122 and the bottom sheet 120. In this manner, core 102B (including ground layer 108B), for example, is formed.

At operation 208, an insulator blank 126 (which may also be referred to herein as a plain insulator) is provided. At operation 210, slots 128 are formed, for example, by removing material from insulator blank 126 (e.g., by punching. Slots 128 correspond to slots 124 in that they are aligned with each other, respectively, in PCB 100 (as shown in FIG. 2F). In this manner, insulator 104B, for example, is formed.

In the illustrated embodiment, at operation 212, insulator 104B is stacked on core 102B. In addition, electromagnetic shields 130A and 130B (collectively "EMSs 130") are placed in slots 124 and 128. At operation 214, more layers are stacked (as indicated by the ellipses in FIG. 2G) such as, for example, core 102C (including ground layer 108C). With subsequent stacking steps, PCB 100 can be completed.

In the illustrated embodiment of PCB 100, traces 1141-114N are high-speed communication channels that can benefit from electromagnetic shielding. Therefore, EMSs 130 are comprised of electrically conductive material that is electrically connected to ground layers 108B and 108C to locally shield traces 1141-114N. As shown, EMSs 130 extend through ground layer 108B and contact the sides of slots 124, and EMSs 130 contact the bottom surface of ground layer 108C, although other contact geometries are possible. In some embodiments, EMSs 130 are comprised of a malleable metal such as, for example, gold or copper. In other embodiments, EMSs 130 are comprised of a low temperature solder that melts and/or wicks at the lamination temperature of PCB 100 to ensure electrical connections with ground layers 108B and 108C. EMSs 130 can be placed at operation 212, for example, by an operator or a pick-and-place robot.

After curing PCB 100, the resulting structure includes an electrically conductive box (à la a Faraday cage) around traces 1141-114N that is formed by EMSs 130 and ground layers 108B and 108C. This box was created during the normal construction of PCB 100, as opposed to being a post-production process like edge plating. The boxes are also relatively small so they take up minimal space in PCB 100, which allows for PCB 100 to have more features. In addition, the boxes can be created using conventional tooling since their dimensions are on the same order of magnitude as the other features of PCB 100. Furthermore, in cases where electromagnetic interference is discovered after designing a printed circuit board, only two or three layers of the board need to be changed in order to implement such local EMSs. In the illustrated example, core 102B and insulator 104B would be changed, and core 102C might be changed, for example, if EMSs 130 are taller and ground layer 108C has slots cut in it that correspond to slots 124 and 128.

Figure 4:
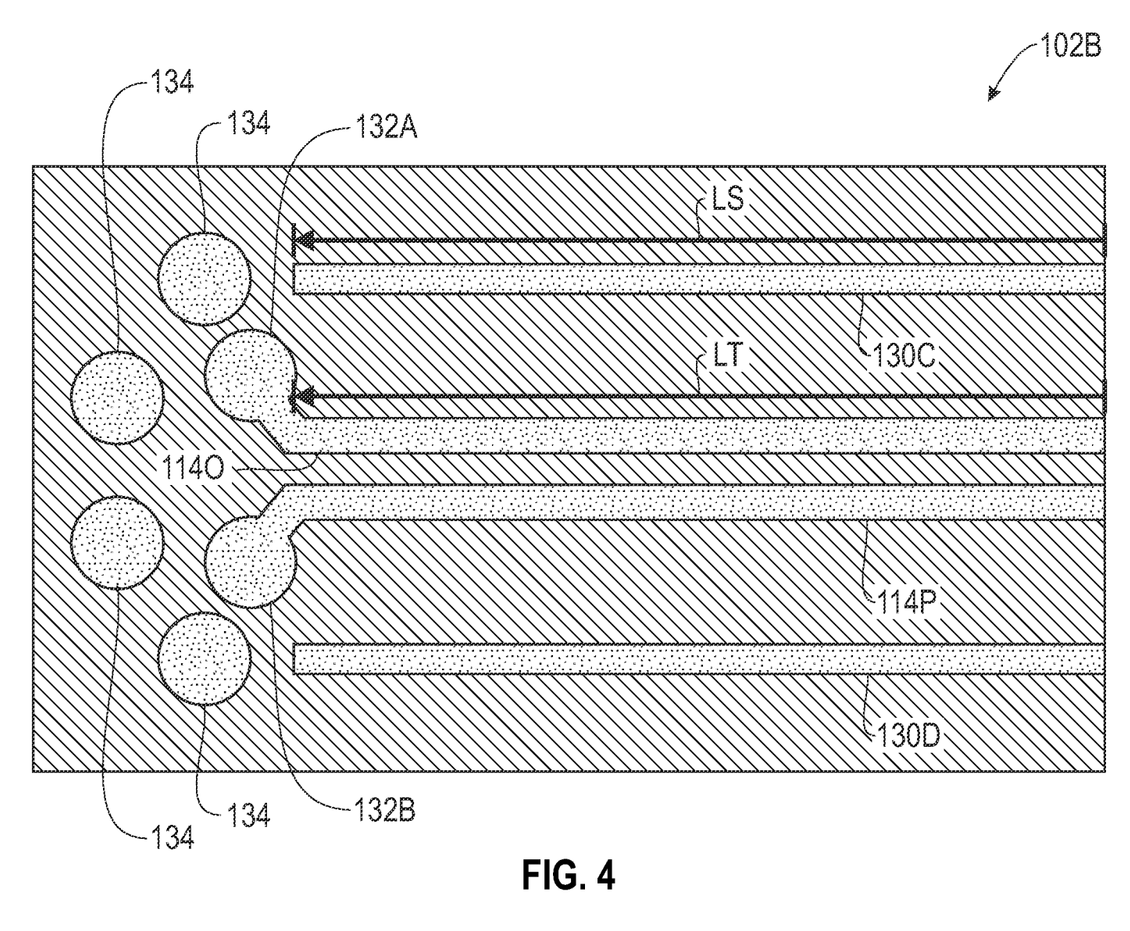
FIG. 4 is a top view of a portion of core layer of the multi-layer circuit board, in accordance with an embodiment of the present disclosure.

FIG. 4 is a top view of a portion of core 102B that was not shown in FIGS. 1-3. In the illustrated embodiment, traces 1140 and 114P are shielded by EMSs 130C and 130D. Traces 1140 and 114P extend parallel alongside each other, and EMSs 130C and 130D extend parallel to traces 1140 and 114P on either side of traces 1140 and 114P, respectively. With respect to core 102B, traces 1140 and 114P terminate at communication vias 132A and 132B (collectively "vias 132"), respectively. Vias 132 extend into and/or out of the page to other layers of PCB 100 (shown in FIG. 1). EMSs 130C and 130D extend about 100% of the lengths of traces 1140 and 114P (as indicated by dimension lines LS and LT, respectively), so EMSs 130C and 130D terminate proximate to an array of shielding vias 134. In other words, dimensional lines LS and LT are about equal in the embodiment of FIG. 4. In some embodiments, EMSs 130C and/or 130D are shorter/terminate earlier so that they extend only about 95% or 90% of the lengths of traces 1140 and/or 114P. In some embodiments, the distance between EMS 130C and trace 1140 and the distance between EMS 130D and trace 114P are equal to or greater than twice the electric field radius (which can vary by the frequency of the electromagnetic radiation that traces 1140 and 114P are being shielded from).

In the illustrated embodiment, shielding vias 134 protect traces 1140 and 114P and vias 132 from electromagnetic interference from the side opposite to EMSs 130C and 130D. Unlike EMSs 130C and 130D, which are continuous strips, shielding vias 134 are discreet, discontinuous elements which are susceptible to certain frequencies of electromagnetic radiation based on the spacing therebetween.

Figure 5:
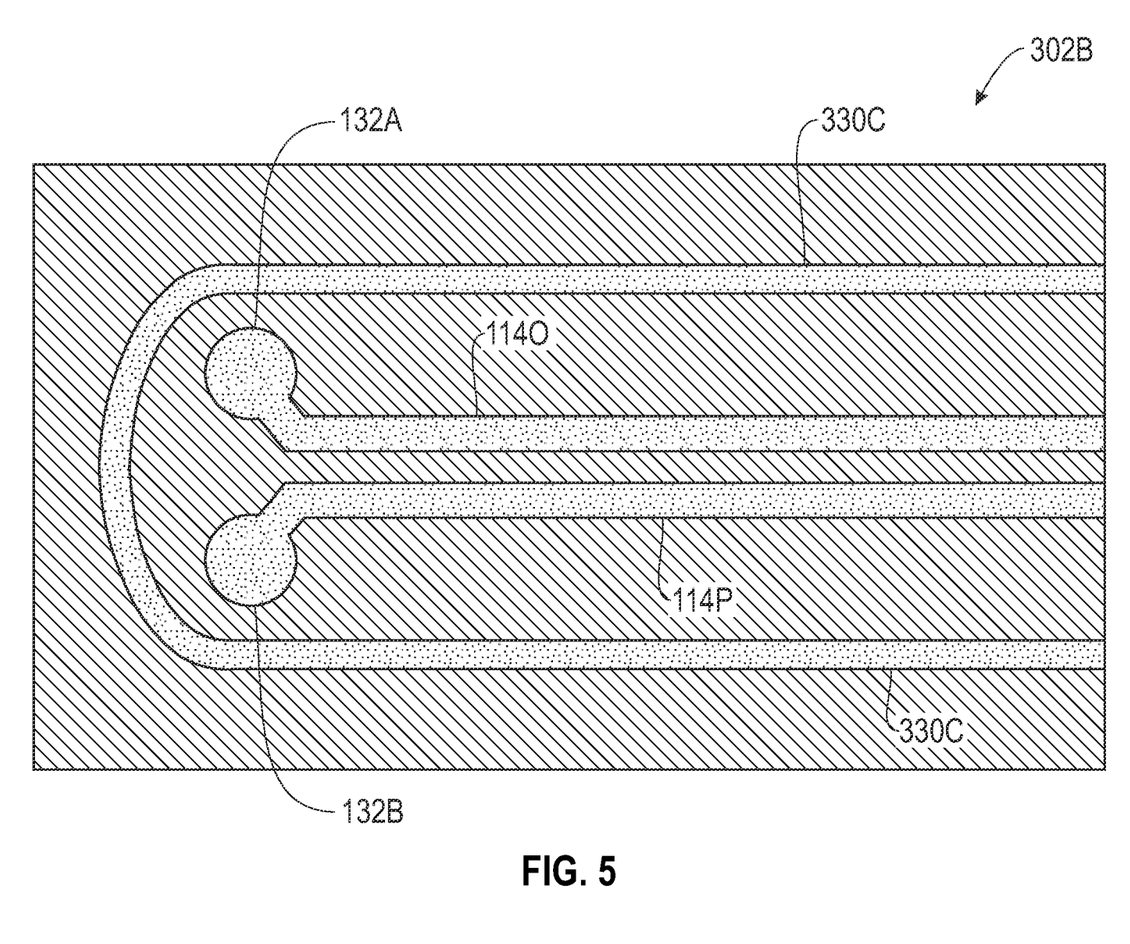
FIG. 5 is a top view of an alternative core layer of the multi-layer circuit board, in accordance with an embodiment of the present disclosure.

FIG. 5 is a top view of an alternative core 302B of PCB 100. In the illustrated embodiment, there is one continuous shield around the termination of traces 1140 and 114P, and there is no array of shielding vias 134 since traces 1140 and 114P are at least partially surrounded by EMS 330C. For example, EMS 330C extends alongside trace 1140, beyond via 132A, around via 132B, and alongside trace 114P. Such a continuous shielding arrangement lacks the frequency-based susceptibility associated with shielding vias 134.

Figure 6A:
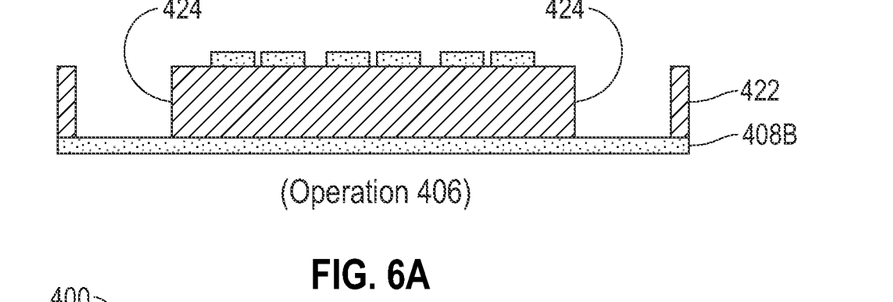
FIGS. 6A and 6B are side cross-sectional views of alternative stages in the manufacture of the portion of the multi-layer circuit board, in accordance with an embodiment of the present disclosure.
Figure 6B:
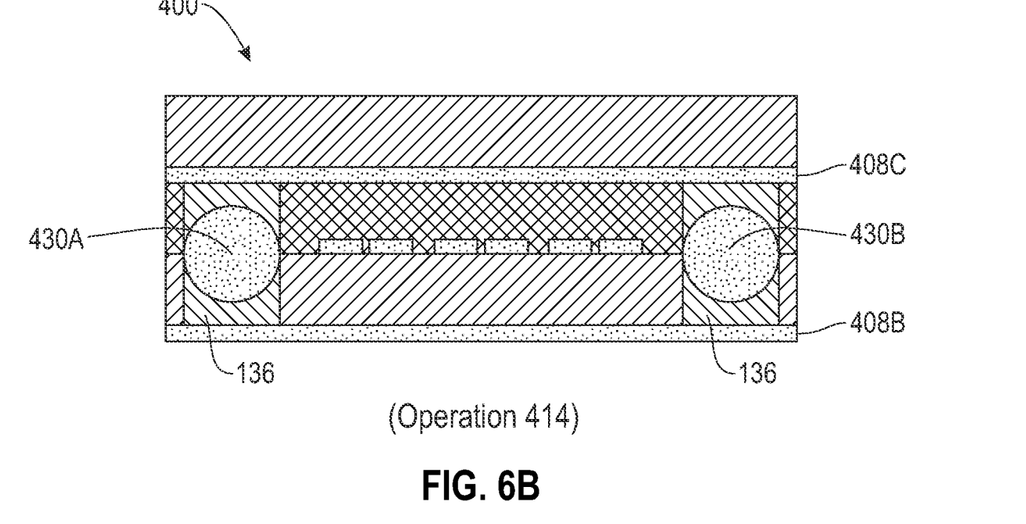

FIGS. 6A and 6B are side cross-sectional views of stages of in the manufacture of the portion of PCB 400 after alternative operations 406 and 414. In the illustrated embodiment, at operation 406 (an alternative to operation 206, shown in FIG. 3), grooves 424 only extend through core center 422 and stop at ground layer 408B. At operation 414 (an alternative to operation 214, shown in FIG. 3), EMSs 430A and 430B are bonded to ground layers 408B and 408C using bonding material 136 since EMSs 430A and 430B have circular cross-sections (as opposed to rectangular ones with larger end surface areas). Bonding material 136 ensures electrical connections since it is comprised of, for example, a low temperature solder designed to melt at the lamination temperature of PCB 400. This prevents EMSs 430A and 430B from becoming ungrounded antennas that could negatively affect the performance of PCB 400.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains," or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing Figures. The terms "overlying," "atop," "on top," "positioned on," or "positioned atop" mean that a first element, such as a first structure, is present on a second element, such as a second structure, wherein intervening elements such as an interface structure can be present between the first element and the second element.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit board comprising:
    a first ground layer;
    a first core layer positioned on the first ground layer;
    an insulating layer positioned on the first core layer;
    a first trace positioned between the first core layer and the insulating layer;
    a second ground layer positioned on the insulating layer; and
    a first electromagnetic shield (EMS) extending between and electrically connected to the first ground layer and the second ground layer alongside the first trace to shield the first trace from electromagnetic radiation, wherein the first EMS extends into and through the first ground layer and is electrically connected to the first ground layer on a first side of the first EMS, and wherein the first EMS does not extend into and through the second ground layer on a second side of the first EMS;
    wherein the first EMS extends along at least 90% of a length of the first trace.

2. The circuit board of claim 1, further comprising a second trace extending alongside the first trace on an opposite side of the first trace from the first EMS.

3. The circuit board of claim 2, further comprising a second EMS extending between and electrically connected to the first ground layer and the second ground layer alongside the second trace to shield the first trace and the second trace from electromagnetic radiation.

4. The circuit board of claim 3, wherein the second EMS extends along at least 90% of the length of the first trace.

5. The circuit board of claim 3, wherein the first EMS and the second EMS are comprised of a metallic material.

6. The circuit board of claim 1, wherein the first EMS extends along at least 95% of the length of the first trace.

7. The circuit board of claim 1, wherein the first EMS extends beyond an end of the length of the first trace.

8. A circuit board comprising:
    a first ground layer;
    a first core layer positioned on the first ground layer;
    an insulating layer positioned on the first core layer;
    a first trace positioned between the first core layer and the insulating layer;
    a second ground layer positioned on the insulating layer;
    a first electromagnetic shield (EMS) extending between and electrically connected to the first ground layer and the second ground layer alongside the first trace to shield the first trace from electromagnetic radiation, wherein the first EMS extends into and through the first ground layer and is electrically connected to the first ground layer on a first side of the first EMS, and wherein the first EMS does not extend into and through the second ground layer on a second side of the first EMS; and
    a second EMS extending between and electrically connected to the first ground layer and the second ground layer alongside a second trace on an opposite side of the first trace from the first EMS to shield the first trace and the second trace from electromagnetic radiation.

9. The circuit board of claim 8, further comprising the second trace extending alongside the first trace between the first EMS and the second EMS.

10. The circuit board of claim 9, wherein the first EMS and the second EMS extend along at least 90% of a length of the first trace and/or the second trace.

11. The circuit board of claim 10, wherein the first EMS extends beyond an end of the length of the first trace and/or the second trace.

12. The circuit board of claim 8, wherein the first EMS and the second EMS are comprised of a metallic material.

13. The circuit board of claim 8, wherein the first EMS is bonded to the first ground layer on a bottom of the first EMS using a bonding material.

14. A circuit board comprising:
    a first ground layer;
    a first core layer positioned on the first ground layer;
    an insulating layer positioned on the first core layer;
    a first trace positioned between the first core layer and the insulating layer and connected to a via;
    a second ground layer positioned on the insulating layer; and
    an electromagnetic shield (EMS) extending between and electrically connected to the first ground layer and the second ground layer alongside a first side of the first trace, around the via, and alongside a second side of the first trace to at least partially surround the first trace and to shield the first trace from electromagnetic radiation, wherein the EMS extends into and through the first ground layer and is electrically connected to the first ground layer on a first side of the EMS, and wherein the EMS does not extend into and through the second ground layer on a second side of the EMS.

15. The circuit board of claim 14, further comprising a second trace extending alongside the first trace that is at least partially surrounded by the EMS.

16. The circuit board of claim 14, wherein the EMS extends along at least 90% of a length of the first trace.

17. The circuit board of claim 14, wherein the EMS is comprised of a metallic material.

18. The circuit board of claim 14, wherein the EMS is bonded to the first ground layer on a bottom of the EMS using a bonding material.

* * * * *